US010554213B2

(12) United States Patent
Houser

(10) Patent No.: US 10,554,213 B2
(45) Date of Patent: Feb. 4, 2020

(54) DIGITAL COMMUNICATIONS CONVERTER FOR A VEHICLE ANTENNA SYSTEM

(71) Applicant: Peter Bennett Houser, Poway, CA (US)

(72) Inventor: Peter Bennett Houser, Poway, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/014,096

(22) Filed: Jun. 21, 2018

(65) Prior Publication Data

US 2019/0393883 A1 Dec. 26, 2019

(51) Int. Cl.
| | |
|---|---|
| *H03M 1/02* | (2006.01) |
| *H03M 1/66* | (2006.01) |
| *H04B 7/185* | (2006.01) |
| *H01Q 1/32* | (2006.01) |
| *H01Q 1/08* | (2006.01) |
| *H04L 29/06* | (2006.01) |
| *H02M 1/44* | (2007.01) |
| *H04B 7/08* | (2006.01) |

(52) U.S. Cl.
CPC .............. *H03M 1/02* (2013.01); *H01Q 1/085* (2013.01); *H01Q 1/3258* (2013.01); *H03M 1/66* (2013.01); *H04B 7/18506* (2013.01); *H04L 69/08* (2013.01); *H02M 1/44* (2013.01); *H04B 7/0802* (2013.01)

(58) Field of Classification Search
CPC .......... H03M 1/02; H04B 7/0802; H02M 1/44
USPC .................... 341/108; 455/277.1, 277.2, 298
See application file for complete search history.

(56) References Cited

U.S. PATENT DOCUMENTS

| | | | |
|---|---|---|---|
| 6,175,327 B1 | 1/2001 | Lin et al. | |
| 7,265,792 B2 | 9/2007 | Favrat et al. | |
| 2002/0111149 A1* | 8/2002 | Shoki | ................... H01Q 1/3275 455/277.1 |

* cited by examiner

*Primary Examiner* — Joseph J Lauture
(74) *Attorney, Agent, or Firm* — Tarolli, Sundeheim, Covell & Tummino LLP

(57) ABSTRACT

One example includes a digital communications converter. The converter includes at least one analog signal port configured to couple to at least one radiating element associated with an antenna structure coupled to an exterior surface of a vehicle. The at least one analog signal port can be configured to at least one of transmit and receive analog radio frequency (RF) signals respectively to and from the at least one radiating element. The converter also includes a digital interface configured to at least one of receive the analog RF signals or transmit the analog RF signals via the respective at least one analog signal port. The converter is also configured to convert between the analog RF signals and digital communication signals on a digital transmission medium that are at least one of transmitted to the digital communications converter via a digital communications cable and transmitted from the digital communications converter via the digital communications cable.

20 Claims, 4 Drawing Sheets

DIGITAL COMMUNICATIONS CONVERTER FOR A VEHICLE ANTENNA SYSTEM

TECHNICAL FIELD

The present invention relates generally to communication systems, and specifically to a digital communications converter for a vehicle antenna system.

BACKGROUND

Wireless communications is a vitally important aspect of modern commercial and military logistics applications. Commercial and military vehicles require the capability of at least one of transmitting and receiving wireless communications signals, such as to support voice communications between the vehicle and a control center, or to provide wireless control commands (e.g., with respect to unmanned or autonomous vehicles). Such wireless communications are provided to and/or from the vehicle based on vehicle antenna systems that may be distributed across one or more exterior surfaces of the vehicle. For example, a given aircraft, spacecraft, water craft, or even terrestrial vehicle may require a number of different antennae distributed across the exterior of the vehicle to provide a variety of different aspects of communication. An example of such antenna systems includes conventional blade and whip antennas that include an interface with radio signal processing equipment using an analog interface. As an example, such an interface may include a large diameter coaxial cable with low signal loss characteristics and which may be communicatively coupled to a dedicated radio signal processing device.

SUMMARY

One example includes a digital communications converter. The converter includes at least one analog signal port configured to couple to at least one radiating element associated with an antenna structure coupled to an exterior surface of a vehicle. The at least one analog signal port can be configured to at least one of transmit and receive analog radio frequency (RF) signals respectively to and from the at least one radiating element. The converter also includes a digital interface configured to at least one of receive the analog RF signals or transmit the analog RF signals via the respective at least one analog signal port. The converter is also configured to convert between the analog RF signals and digital communication signals on a digital transmission medium that are at least one of transmitted to the digital communications converter via a digital communications cable and transmitted from the digital communications converter via the digital communications cable.

Another example includes a vehicle antenna system. The antenna system includes an antenna structure coupled to an exterior surface of a vehicle. The antenna structure includes at least one radiating element configured to at least one of wirelessly transmit and receive analog radio frequency (RF) signals. The system also includes a digital communications converter. The digital communications converter includes an analog signal port coupled to the at least one radiating element and at least one analog/digital converter coupled to the respective at least one analog signal port and being configured to at least one of convert the analog RF signals received via the at least one radiating element to digital RF signals and convert the digital RF signals to the analog RF signals to be transmitted via the at least one radiating element. The digital communications converter also includes a digital interface configured to at least one of generate digital communication signals in a digital signal protocol on a digital transmission medium based on the digital RF signals and generate the digital RF signals based on the digital communication signals in the digital transmission medium. The digital communications converter further includes a digital medium port configured to receive the digital communications cable for transmission of the digital communications signal between the digital communications converter and a control system associated with the vehicle.

Another example includes a vehicle communication system. The vehicle communication system includes a vehicle antenna system. The vehicle antenna system includes an antenna structure coupled to an exterior surface of a vehicle. The antenna structure includes at least one radiating element configured to at least one of wirelessly transmit and receive analog RF signals. The vehicle antenna system also includes a digital communications converter comprising at least one analog signal port coupled to the at least one radiating element and a digital interface configured to at least one of receive the analog RF signals or transmit the analog RF signals via the respective at least one analog signal port and to convert between the analog RF signals and digital communication signals on a digital transmission medium that are at least one of transmitted to the digital communications converter via a digital communications cable and transmitted from the digital communications converter via the digital communications cable. The vehicle communication system also includes a digital vehicle control system configured to generate and receive the digital communication signals. The vehicle communication system further includes a digital communications cable interconnecting the vehicle antenna system and the digital vehicle control system and being configured to propagate the digital communications signal on the digital transmission medium between the vehicle antenna system and the digital vehicle control system.

DETAILED DESCRIPTION

The present invention relates generally to communication systems, and specifically to a digital communications converter for a vehicle antenna system. The vehicle antenna system can include an antenna structure that can be implemented, for example, as a whip antenna or a blade antenna that is coupled to an exterior of a vehicle, such as an aircraft. The vehicle antenna system can also include a digital communications converter that is located proximal to or enclosed within the antenna structure. The digital communications converter is configured to convert between signals-in-space (SiS) that are transmitted from and/or received at a radiating element associated with the antenna structure and digital communication signals that can propagate on a digital cable (e.g., to and/or from a digital vehicle control system).

As an example, the digital communications converter can include an analog signal port that is coupled to the radiating element of the antenna structure. For example, the analog signal port can be integrally coupled to the radiating element, such that the digital communications converter can be integrally formed with the antenna structure (e.g., can be enclosed within the antenna structure, such as within the fairing form of a blade antenna). As another example, the analog signal port can be configured to mechanically couple directly to an analog signal port of the antenna structure that is integrally formed with the radiating element. Therefore, the analog signal port can be configured to plug into legacy antenna structures. For example, the digital communications converter can have a substantially compatible dimensional form-factor, including mounting holes and/or aerodynamic physical dimensions.

For example, the digital communications converter can also include a digital interface that is configured to generate digital communication signals based on the analog RF signal received at the antenna structure, or to convert the digital communication signals into an analog RF signal for transmission from the antenna structure as an SiS. For example, the digital communication signals can be generated based on digital RF signals that are received from an analog-to-digital converter (ADC) that is configured to convert analog RF signals corresponding to the received SiS into the digital RF signals. Therefore, the digital interface can be configured to encode the digital RF signals into a digital communications protocol, such as for transmission on a digital communication cable in a given communication medium (e.g., an optical fiber). As another example, the digital communication signals can be received from the digital communication cable, such that the digital interface can generate the digital RF signals based on the digital communication signals. Therefore, a digital-to-analog converter (DAC) can convert the digital RF signals into analog RF signals for transmission as the SiS from the antenna structure.

Figure 1:
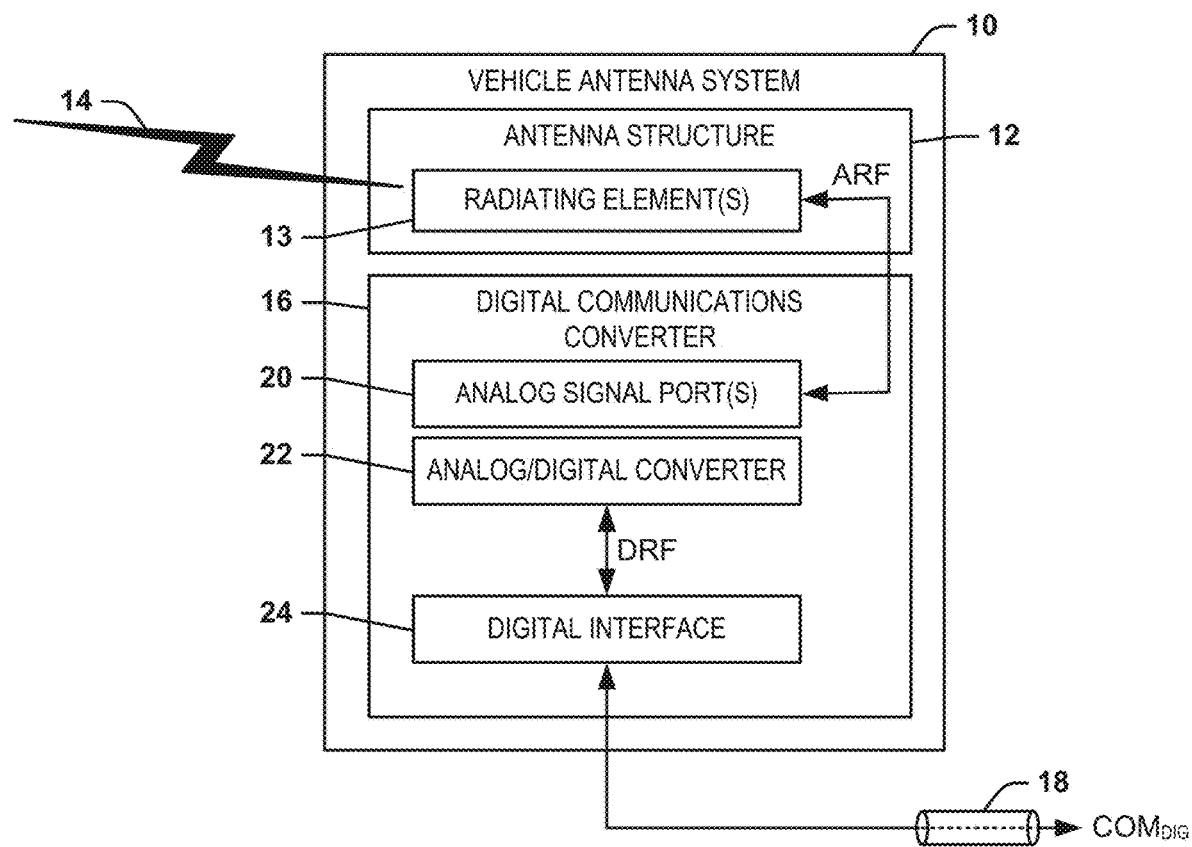
FIG. 1 illustrates an example of a vehicle antenna system.

FIG. 1 illustrates an example of a vehicle antenna system 10. The vehicle antenna system 10 can be implemented for wireless communication to or from a vehicle, such as an aircraft, a watercraft, a spacecraft, a terrestrial vehicle, or any of a variety of other types of manned or unmanned vehicles.

The vehicle antenna system 10 includes an antenna structure 12 that can be implemented, for example, as a whip antenna or a blade antenna arrangement that is coupled to an exterior surface of the associated vehicle. The antenna structure 12 can thus include at least one radiating element 13 (e.g., monopole or dipole arrangement) to wirelessly transmit and/or receive signals-in-space (SiS), as demonstrated in the example of FIG. 1 at 14. The vehicle antenna system 10 can also include a digital communications converter 16 that is located proximal to or enclosed within the antenna structure 12. The digital communications converter 16 is configured to convert between the analog RF signals ARF that are transmitted from and/or received at the antenna structure 12 and digital communication signals $COM_{DIG}$ that can propagate on a digital cable 18, such as to and/or from a digital vehicle control system (not shown). As described herein, it is to be understood that the digital communications converter 16 is not limited to conversion between analog and digital and/or digital to analog signals in the RF frequency range, but could also modulate and/or demodulate in the intermediate (IF) frequency range as well as or in addition to conversion between analog and digital and/or digital to analog in the RF frequency range.

In the example of FIG. 1, the digital communications converter 16 includes at least one analog signal port 20 that is coupled to the radiating element(s) 13 of the antenna structure 12. As an example, the digital communications converter 16 can be integrally formed with the antenna structure 12, such as based on the analog signal port(s) 20 being integrally coupled to the radiating element(s) 13 of the antenna structure 12. As described herein, the term "integrally coupled to the radiating element(s)" with respect to the analog signal port(s) 20 refers to a fixed coupling, and thus absent a removable mechanical coupling structure or any sort of interposing cable or other connection device. Therefore, in this example of integral coupling, the connection between the analog signal port(s) 20 and the radiating element(s) 13 of the antenna structure 12 can be based on a unitary metallic material associated with both the analog signal port(s) 20 and the radiating element(s) 13 of the antenna structure 12, or based on a functionally permanent connection (e.g., a solder connection or other materially permanent conductive connection). In the example of FIG. 1, an analog RF signal ARF propagates between the analog signal port(s) 20 and the radiating element(s) 13, such as based on SiS 14 received at the radiating element(s) 13 or such as provided to the radiating element(s) 13 to be transmitted as SiS 14.

As another example, the antenna structure 12 can include an analog signal port, such as similar to legacy antenna structures (e.g., blade or whip antennas), such as typically configured to receive an RF cable. However, for example, instead of an RF cable that is plugged into the analog signal port of the antenna structure 12, the analog signal port(s) 20 can plug directly into associated analog signal port (e.g., within the antenna structure 12). As a result, the digital communications converter 16 and the antenna structure 12 can be formed as separate components that can be mechanically and communicatively coupled via the analog signal port(s) 20 and an analog signal port associated with the antenna structure 12. As a result, the analog signal port(s) 20 can be configured to be plugged into a legacy antenna structure 12. For example, the digital communications converter 16 can have a substantially compatible dimensional form-factor, including mounting holes and/or aerodynamic physical dimensions (e.g., to correspond to a fairing, like the antenna structure 12 arranged as a blade antenna).

In the example of FIG. 1, the digital communications converter 16 also includes an analog/digital converter 22 and a digital interface 24. The analog/digital converter 22 can be configured as at least one of an analog-to-digital converter (ADC) or a digital-to-analog converter (DAC). For example, the analog/digital converter 22 can implement digital RF signals, demonstrated in the example of FIG. 1 as digital RF signals DRF, that correspond to the analog RF signals ARF corresponding to the SiS and/or the digital communication signals $COM_{DIG}$, such as to generate the digital RF signals DRF based on the analog RF signals ARF corresponding to received SiS 14 and/or to generate the analog RF signals ARF for transmission as SiS 14 from the antenna structure 12 based on digital RF signals generated by the digital interface 24 (e.g., based on received digital communication signals $COM_{DIG}$). The digital interface 24 can be configured to encode the digital RF signals to generate the digital communication signals $COM_{DIG}$ corresponding to a digital communications protocol for transmission on the digital cable 18 in a given communication medium (e.g., an optical fiber). For example, the encoding scheme can correspond to any of a variety of digital signal protocols, such as, for example, VITA 49. As another example, the digital communication signals $COM_{DIG}$ can be received from the digital cable 18, such that the digital interface 24 can generate the digital RF signals based on the digital communication signals $COM_{DIG}$.

Therefore, as described herein, the vehicle antenna system 10 provides for signal conversion between SiS 14 and digital communication signals $COM_{DIG}$ at the vehicle antenna system 10, as opposed to typical vehicle antenna systems that implement RF cables that interconnect a digital vehicle control system and the antenna systems coupled thereto. As an example, in a typical vehicle communication system, multiple RF cables can connect between the digital vehicle control system(s) and each of the vehicle antenna systems distributed along the exterior surfaces of the vehicle. Typical RF cables (e.g., coaxial cables) can be heavy, can introduce signal losses that can be undesirably large for longer lengths of the RF cables, and can be substantially inflexible. As a result, providing long lengths of RF cables throughout the vehicle to connect the digital vehicle control system(s) to the vehicle antenna systems can provide significant weight-loading, can introduce deleterious signal losses, and can be difficult from a labor standpoint due to the relative inflexibility of the RF cables. However, by providing the analog/digital conversion at the vehicle antenna systems 10 distributed along the exterior surfaces of the vehicle, as described herein, the digital vehicle control system can be coupled to the vehicle antenna systems 10 via digital cables, such as the digital cable 18, which can be significantly lighter in weight, can introduce significantly less signal losses, and can be significantly more flexible and easier to install. In addition, the digital medium that interconnects between the digital vehicle control system(s) and the vehicle antenna systems 10 can be provided as a common high-speed platform digital backbone (e.g., VITA 49). As a result, by providing the digital conversion at the vehicle antenna systems 10, implementation of the vehicle antenna systems 10 can provide for a significant reduction in the size, weight, and/or power (SWAP) of the vehicle platform. Furthermore, certain safety considerations can be alleviated by implementing non-conductive digital cables (e.g., fiber-optic cables) in the associated vehicle, such as through fuel reservoirs in wings of aircraft, as opposed to conductive RF cables in typical aircraft communications systems.

Figure 2:
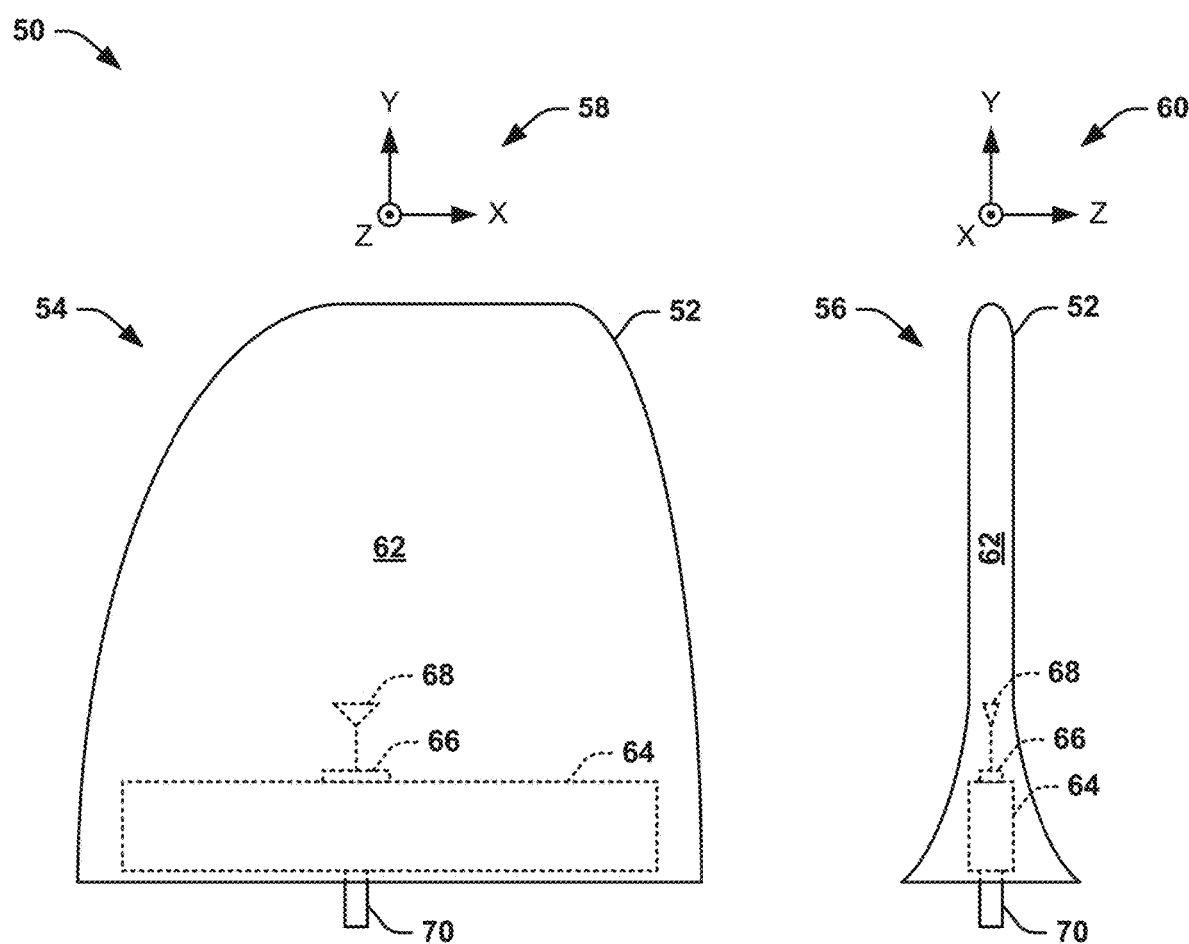
FIG. 2 illustrates an example diagram of a vehicle antenna system.

FIG. 2 illustrates an example diagram 50 of a vehicle antenna system 52. The diagram 50 demonstrates a vehicle antenna system, arranged as a blade antenna, in a first view 54 and in a second view 56, based on respective Cartesian coordinate axes 58 and 60, respectively. As an example, the vehicle antenna system 52 can correspond to the vehicle antenna system 10 in the example of FIG. 1. Therefore, reference is to be made to the example of FIG. 1 in the following description of the example of FIG. 2.

The vehicle antenna system 52 includes an antenna structure 62, which can be defined by the shape of the vehicle antenna system 52 itself. For example, the blade antenna structure 62 of the vehicle antenna system 52 can be such that the exterior of the blade antenna structure 62 can be coated with a metallic material, such that the metallic material can act as a radiating element for receiving and/or transmitting RF signals (e.g., the SiS 14). In the example of FIG. 2, the blade antenna structure 62 is provided as a fairing to mitigate drag, such that the vehicle antenna system 52 can be mounted on an external surface of an aircraft, for example. Therefore, as the associated aircraft travels in the "−X" direction based on the Cartesian coordinate systems 58 and 60, the vehicle antenna system 52 can mitigate drag based on the blade antenna structure 62.

The vehicle antenna system 52 includes a digital communications converter 64 mounted in a fixed manner inside the blade antenna structure 62, and thus inside the fairing shape of the vehicle antenna system 52. In the example of FIG. 2, the digital communications converter 64 includes at least one analog signal port 66 that is coupled to a radiating element 68 of the blade antenna structure 62. For example, the radiating element 68 of the blade antenna structure 62 can correspond to a metallic coating on an exterior of the fairing shape of the blade antenna structure 62. As an example, the digital communications converter 64 can be integrally formed with the blade antenna structure 62, such as based on the analog signal port(s) 66 being integrally coupled to the radiating element(s) 68 of the antenna structure 62. Accordingly, the vehicle antenna system 52 can be fabricated as one integral unit.

As an example, the digital communications converter 64 can correspond to the digital communications converter 16 in the example of FIG. 1. In the example of FIG. 2, the digital communications converter 64 includes a digital medium port 70 that allows the coupling of a digital cable (e.g., the digital cable 18). As an example, the digital medium port 70 can correspond to an optical fiber port to facilitate coupling of an optical fiber that can be configured to propagate the digital communication signals $COM_{DIG}$. Alternatively, the digital medium port 70 can be fixably coupled to the digital cable, as opposed to removably coupled. Therefore, the digital communications converter 64 can provide digital conversion of the RF signals at the vehicle antenna system 52 to facilitate digital communication (e.g., via the digital communication signals $COM_{DIG}$) between the vehicle antenna system 52 and a digital vehicle control system via an associated digital cable.

Figure 3:
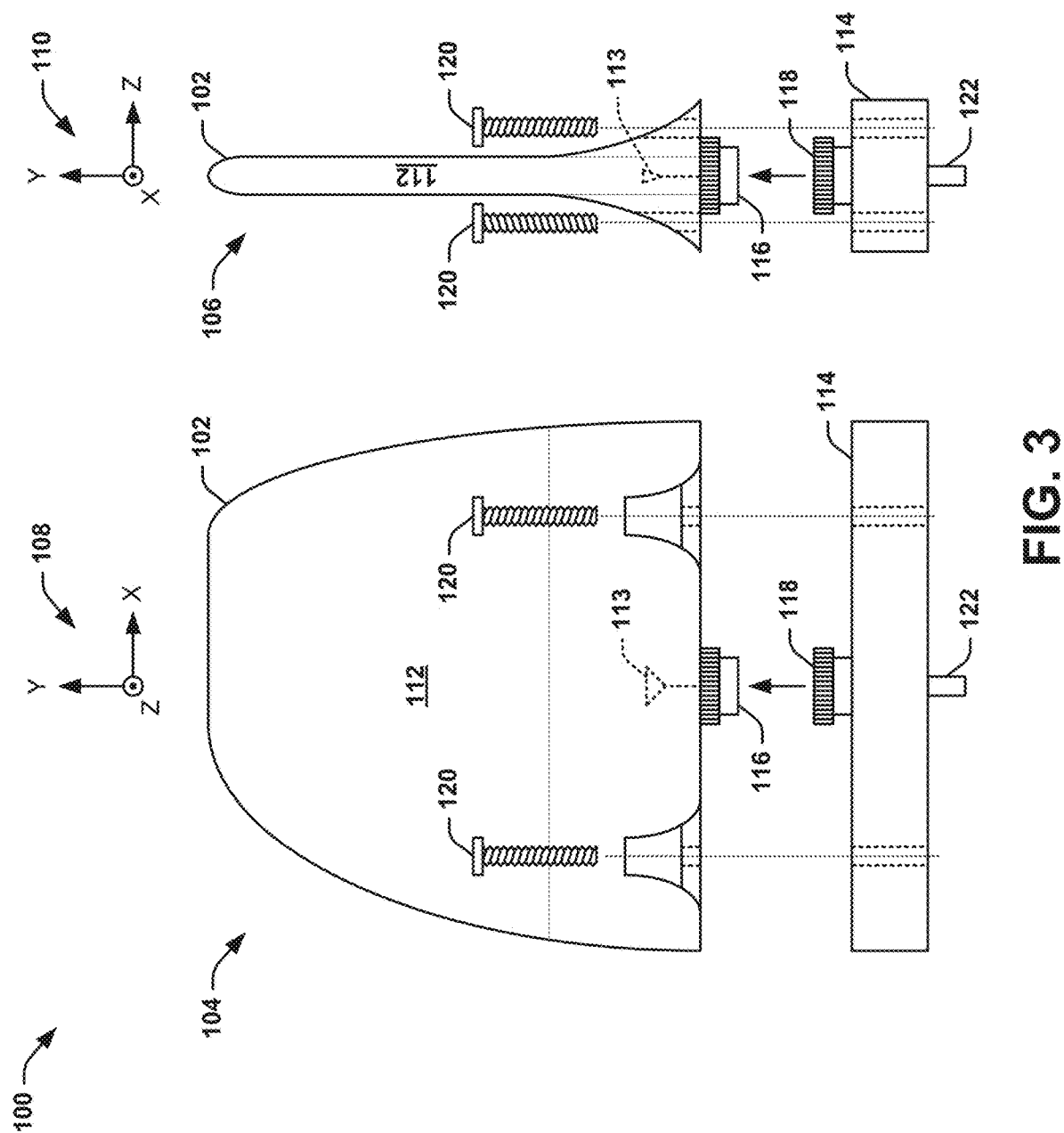
FIG. 3 illustrates another example diagram of a vehicle antenna system.

FIG. 3 illustrates another example diagram 100 of a vehicle antenna system 102. The diagram 100 demonstrates a vehicle antenna system, arranged as a blade antenna, in a first view 104 and in a second view 106, based on respective Cartesian coordinate axes 108 and 110, respectively. As an example, the vehicle antenna system 102 can correspond to the vehicle antenna system 10 in the example of FIG. 1. Therefore, reference is to be made to the example of FIG. 1 in the following description of the example of FIG. 3.

The vehicle antenna system 102 includes an antenna structure 112, which can be defined by the shape of the vehicle antenna system 102 itself. In the example of FIG. 3, the blade antenna structure 112 includes a radiating element 113. In the example of FIG. 3, the blade antenna structure 112 is provided as a fairing to mitigate drag, such that the vehicle antenna system 102 can be mounted on an external surface of an aircraft, for example. Therefore, as the associated aircraft travels in the "−X" direction based on the Cartesian coordinate systems 108 and 110, the vehicle antenna system 102 can mitigate drag based on the blade antenna structure 112. For example, the radiating element 113 of the blade antenna structure 112 can correspond to a metallic coating on an exterior of the fairing shape of the blade antenna structure 112, such that the radiating element can receive and/or transmit RF signals (e.g., the SiS 14).

The vehicle antenna system 102 includes a digital communications converter 114, demonstrated in the example of FIG. 3 as a separate component from the blade antenna structure 112. As an example, the blade antenna structure 112 includes an analog signal port 116, such that the blade antenna structure 112 can correspond to a legacy blade antenna to which an RF cable can be attached to the analog signal port 116. The analog signal port 116 is thus coupled to the radiating element(s) 113 to propagate the RF signals that are received and/or transmitted at and/or from the respective radiating element(s) 113. However, in the example of FIG. 3, the digital communications converter 114 likewise includes an analog signal port 118 that is mechanically and directly coupled to the analog signal port 116 of the blade antenna structure 112. Therefore, the digital communications converter 114 can be coupled to the blade antenna structure 112 as a retrofit to a legacy blade antenna, absent the connection of an RF cable to the analog signal port 116 of the blade antenna structure 112.

In addition, in the example of FIG. 3, the digital communications converter 114 can be arranged to have an approximately compatible dimensional form-factor with respect to the blade antenna structure 112, and thus to the fairing radiating element. In the example of FIG. 3, the digital communications converter 114 can be substantially enclosed in a material (e.g., epoxy or metal) to protect the electronics therein. In addition, the enclosure of the digital communications converter 114 can have dimensions that are substantially similar to the blade antenna structure 112 to provide suitable resistance to wind drag (e.g., by likewise being arranged as a fairing). Furthermore, in the example of FIG. 3, the digital communications converter 114 can have a common bolt-pattern, demonstrated by bolts 120 passing through each of the blade antenna structure 112 and the digital communications converter 114. Therefore, the approximately compatible dimensional form-factor of the digital communications converter 114 with respect to the blade antenna structure 112 can facilitate ease of installation for the blade antenna structure 112 being configured as a legacy blade antenna. Accordingly, the digital communications converter 114 can be installed in the same location using substantially similar or the same hardware (e.g., the bolts 120) to mount the digital communications converter 114 between the blade antenna structure 112 and the exterior surface of the vehicle.

Similar to as described previously in the example of FIG. 2, the digital communications converter 114 can correspond to the digital communications converter 16 in the example of FIG. 1. In the example of FIG. 3, the digital communications converter 114 includes a digital medium port 122 that allows the coupling of a digital cable (e.g., the digital cable 18). As an example, the digital medium port 122 can correspond to an optical fiber port to facilitate coupling of an optical fiber that can be configured to propagate the digital communication signals $COM_{DIG}$. Alternatively, the digital medium port 122 can be fixably coupled to the digital cable, as opposed to removably coupled. Therefore, the digital communications converter 114 can provide digital conversion of the RF signals at the vehicle antenna system 102 to facilitate digital communication (e.g., via the digital communication signals $COM_{DIG}$) between the vehicle antenna system 102 and a digital vehicle control system via an associated digital cable.

While the examples of FIGS. 2 and 3 demonstrate the vehicle antenna systems 52 and 102 being demonstrated as blade antennas, having respective blade antenna structures 62 and 112, respectively, it is to be understood that other types of vehicle antennas can be implemented instead. For example, the vehicle antenna systems 52 and 102 can instead be configured as whip antennas, or any of a variety of other antennas that have a digital communications converter (e.g., the digital communications converter 64 and 114, respectively) co-located with the respective antenna structures.

Figure 4:
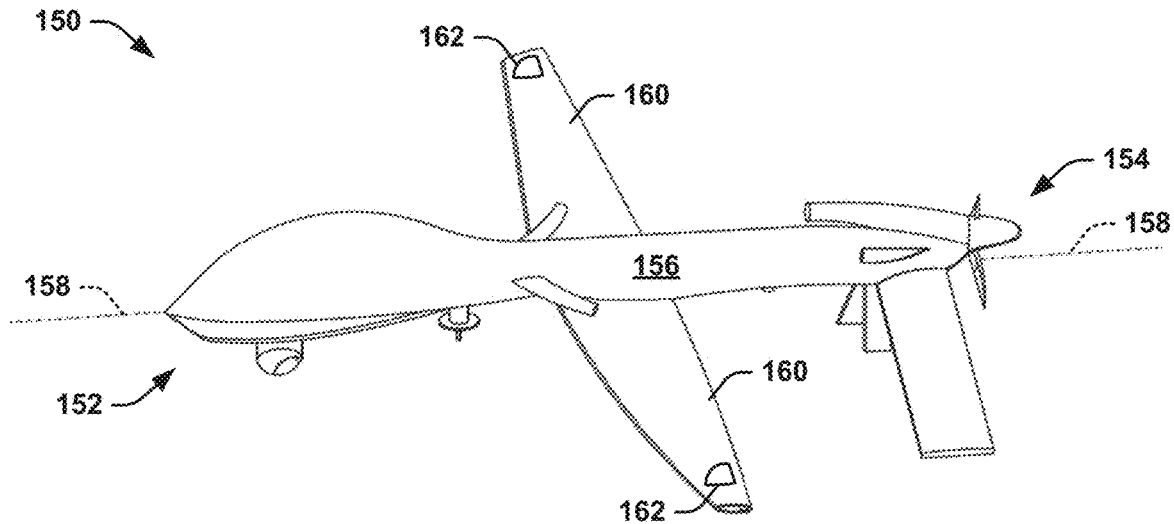
FIG. 4 illustrates an example of an aircraft.

FIG. 4 illustrates an example of an aircraft 150. As an example, the aircraft 150 can include one or more vehicle antenna systems 162 coupled to respective exterior surfaces thereto. The aircraft 150 extends from a first or fore end 152 to a rear or aft end 154. The aircraft 150 includes a fuselage 156 extending generally along a centerline 158. A pair of wings 160 extends from the fuselage 156 on opposite sides of the centerline 158.

In the example of FIG. 4, the aircraft 150 can be configured as an unmanned aerial vehicle (UAV). As an example, the aircraft 150 can include a plurality of vehicle antenna systems 162 coupled to multiple locations on the exterior surface of the aircraft 150. While the vehicle antenna systems 162 are demonstrated as being mounted to the wings 160, it is to be understood that the vehicle antenna systems 162 can be mounted to a variety of other exterior locations on the aircraft 150. For example, the vehicle antenna systems 162 can correspond to either or both of the vehicle antenna systems 52 and/or 112 located at various locations on the exterior surface. In addition, the aircraft 150 can include a digital vehicle control system (not shown) located therein that provides control of electronic and physical systems the aircraft 150.

For example, a user or control center (e.g., control tower) can send SiS to the aircraft 150 that can be received at the respective antenna structures of the vehicle antenna systems 162. As an example, the SiS can be voice signals for communication with a pilot or passenger(s), or can be control commands for commanding the aircraft 150, or a variety of other types of communication signals. As described herein, the term "communication signals" can correspond to any type of wireless signal that is cooperative or uncooperative (e.g., signal jamming) or that carries any form of data. The vehicle antenna systems 162 can thus convert the analog RF signals corresponding to the SiS to digital RF signals, and then to digital communication signals in any of a variety of digital media (e.g., optical or otherwise), as described herein. Therefore, the digital communication signals can be propagated from the respective vehicle antenna systems 162 to the digital vehicle control system to be processed for delivery of the associated data. Similarly, the digital vehicle control system can generate data in the digital format and transmit the data as the digital communication signals to the respective vehicle antenna systems 162. The vehicle antenna systems 162 can thus convert the digital communication signals into digital RF signals, to analog RF signals, as described herein, such that the analog RF signals can be transmitted as SiS from the vehicle antenna systems 162.

Figure 5:
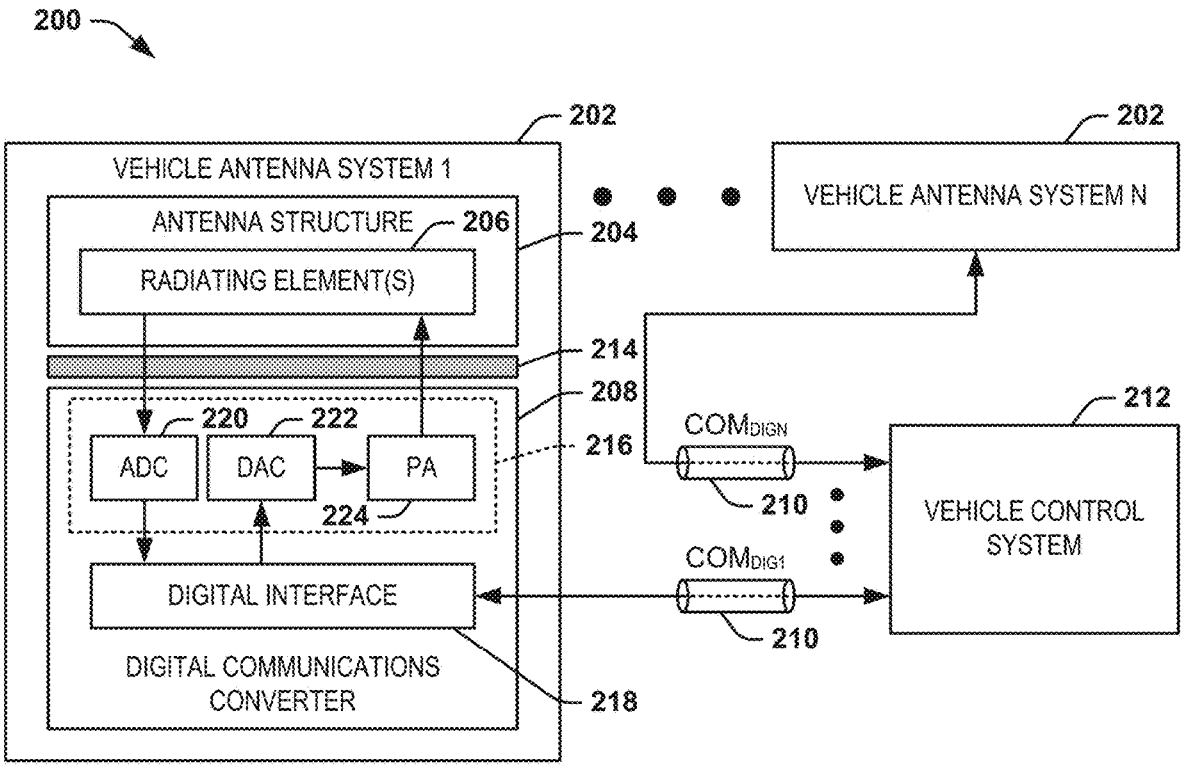
FIG. 5 illustrates an example of a vehicle communication system.

FIG. 5 illustrates an example of a vehicle communication system 200. The vehicle communication system 200 can correspond to a communication system for any of a variety of vehicles, such as the aircraft 150 in the example of FIG. 4, or for any of a variety of other types of vehicles (e.g., a watercraft, a spacecraft, or a terrestrial vehicle).

The vehicle communication system 200 includes a plurality N of vehicle antenna systems 202, where N is a positive integer equal to one or more. As an example, each of the vehicle antenna systems 202 can be configured similarly. Each of the vehicle antenna systems 202 includes an antenna structure 204 that can be implemented, for example, as a whip antenna or a blade antenna arrangement that is coupled to an exterior surface of the associated vehicle (e.g., the aircraft 150). The antenna structure 204 can thus include at least one radiating element 206 (e.g., monopole or dipole arrangement) to wirelessly transmit and/or receive RF signals as SiS. The vehicle antenna system(s) 202 can also each include a digital communications converter 208 that is located proximal to or enclosed within the antenna structure 204, similar to as demonstrated in the example of FIG. 2 or the example of FIG. 3. The digital communications converter 208 is configured to convert between the analog RF signals that are transmitted from and/or received at the antenna structure 204 as the SiS and digital communication signals, demonstrated as $COM_{DIG1}$ through $COM_{DIGN}$, that can propagate on a respective one of a plurality N of digital cables 210.

While the digital cables 210 are demonstrated in the example of FIG. 5 as being discrete cables, it is to be understood that the digital cables 210 could be grouped or partially grouped as or in a physical bus to propagate multiple digital communication signals $COM_{DIG}$. The digital cable(s) 210 can thus propagate the digital communication signals $COM_{DIG1}$ through $COM_{DIGN}$ between the respective one of the vehicle antenna system(s) 202 and a digital vehicle control system 212 that can be configured to provide any of a variety of functions associated with operation of the vehicle. Additionally, while the example of FIG. 5 does not demonstrate power connections to the digital communications converter 208, it is to be understood that the digital communications converter 208 can include a power source, such as provided locally (e.g., via a battery or solar cell) or via one of the digital cables 210 (e.g., as separate power conductors or provided via the digital communications signal $COM_{DIG}$ itself, such as via optical signal power transfer).

In the example of FIG. 5, the digital communications converter 208 and/or the antenna structure 204 include at least one analog signal port 214. As an example, the digital communications converter 208 can be integrally formed with the antenna structure 204, such as based on the analog signal port(s) 214 being integrally coupled to the radiating element(s) 206 of the antenna structure 204 and the digital communications converter 208, similar to as described in the example of FIG. 2. As another example, the digital communications converter 208 can be plugged into the antenna structure 204, such as based on separate respective analog signal port(s) 214 of the antenna structure 204 and the digital communications converter 208 being mechanically and removably attached to each other, similar to as described in the example of FIG. 3.

In the example of FIG. 5, the digital communications converter 208 also includes an analog/digital converter 216 and a digital interface 218. The analog/digital converter 216 includes an ADC 220 that is configured to convert analog RF signals received at the radiating element(s) 206 as SiS via the analog signal port(s) 214 into digital RF signals which are provided to the digital interface 218. The digital interface 218 can thus encode the digital RF signals to generate the corresponding digital communication signals $COM_{DIG}$ in a given digital communications protocol for transmission on the digital cable 210 in a given communication medium (e.g., an optical fiber) to the digital vehicle control system 212. Similarly, the analog/digital converter 216 includes a DAC 222 configured to convert the digital RF signals, such as generated by the digital interface 218 based on the respective digital communication signals $COM_{DIG}$, to the analog RF signals. The analog RF signals can thus be provided to a power amplifier ("PA") 224 that amplifies the analog RF signals and provides the amplified analog RF signals to the radiating element(s) 206 via the analog signal port(s) 214 for transmission as the SiS from the antenna structure 204.

It is to be understood that the example of the given vehicle antenna system 202 is not intended to be limited to as demonstrated in the example of FIG. 5. For example, the digital communications converter 208 can include additional RF front-end receiver circuitry not shown in the example of FIG. 5, such as mixers, downmixers, filters, low-noise amplifiers, and/or a variety of other circuitry configured to process the analog RF signals received at the antenna structure 204 and to convert the analog RF signals to the corresponding digital communication signals $COM_{DIG}$, and to process the digital communication signals $COM_{DIG}$ received via the digital cable 210 for conversion into corresponding analog RF signals for transmission from the antenna structure 204 as the SiS.

Therefore, as described herein, the vehicle antenna system(s) 202 provides for signal conversion between analog and digital signals at the vehicle antenna system(s) 202, as opposed to typical vehicle antenna systems that implement RF cables that interconnect a digital vehicle control system and the antenna systems coupled thereto. By providing the analog/digital conversion at the vehicle antenna systems 202 distributed along the exterior surfaces of the vehicle (e.g., the aircraft 150), as described herein, the digital vehicle control system can be coupled to the vehicle antenna systems 202 via the digital cables 210, which can be significantly lighter in weight, can introduce significantly less signal losses, and can be significantly more flexible and easier to install. As a result, by providing the digital conversion at the vehicle antenna systems 202, implementation of the vehicle antenna systems 202 can provide for a significant reduction in SWAP of the vehicle platform.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A digital communications converter comprising:
   at least one analog signal port configured to couple to at least one radiating element associated with an antenna structure coupled to an exterior surface of a vehicle, the at least one analog signal port being configured to at least one of wirelessly transmit and receive analog radio frequency (RF) signals respectively to and from the at least one radiating element; and
   a digital interface configured to at least one of receive the analog RF signals or transmit the analog RF signals via the respective at least one analog signal port, and to convert between the analog RF signals and digital RF signals and to encode the digital RF signals to generate digital communication signals corresponding to a digital communications protocol for transmission on a digital transmission medium that are at least one of transmitted to the digital communications converter via a digital communications cable and transmitted from the digital communications converter via the digital communications cable.

2. The converter of claim 1, wherein the digital communications converter comprises at least one analog/digital converter comprised of at least one of an analog-to-digital converter (ADC) and a digital-to-analog converter (DAC) coupled to the respective at least one analog signal port and being configured to at least one of convert the analog RF signals to the digital RF signals and convert the digital RF signals to the analog RF signals, wherein the digital interface configured to at least one of generate the digital communication signals in the digital communications protocol on the digital transmission medium based on the digital RF signals and generate the digital RF signals based on the digital communication signals in the digital transmission medium.

3. The converter of claim 2, wherein the at least one analog/digital converter comprises:
an analog-to-digital converter (ADC) configured to convert the analog RF signals received via the at least one radiating element to the digital RF signals;
a digital-to-analog converter (DAC) configured to convert the digital RF signals to the analog RF signals for transmission via the at least one radiating element; and
a power amplifier configured to amplify the analog RF signals for transmission via the at least one radiating element.

4. The converter of claim 1, wherein the antenna structure comprises an analog signal port, wherein the at least one analog signal port of the digital communications converter is mechanically and directly coupled to the analog signal port of the antenna structure, and wherein the digital communications converter has a substantially compatible dimensional form-factor with respect to the at least one radiating element, including mounting holes and aerodynamic physical dimensions.

5. The converter of claim 1, wherein the digital communications converter further comprises a digital medium port configured to receive the digital communications cable for transmission of the digital communications signal between the digital communications converter and a control system associated with the vehicle.

6. A vehicle antenna system comprising the digital communications converter of claim 1, further comprising the antenna structure.

7. The system of claim 6, wherein the antenna structure is arranged as a blade antenna, such that the antenna structure is arranged as a fairing corresponding to the at least one radiating element.

8. The system of claim 7, wherein the antenna structure substantially encloses the digital communications converter.

9. The system of claim 6, wherein the antenna structure is arranged as a whip antenna, such that the at least one radiating element comprises a monopole whip antenna element.

10. The system of claim 6, wherein the at least one analog signal port of the digital communications converter is integrally coupled with the at least one radiating element.

11. A vehicle communication system comprising the vehicle antenna system of claim 6, the vehicle communication system further comprising:
a digital vehicle control system; and
the digital communications cable interconnecting the vehicle antenna system and the digital vehicle control system.

12. A vehicle antenna system comprising:
an antenna structure coupled to an exterior surface of a vehicle, the antenna structure comprising at least one radiating element configured to at least one of wirelessly transmit and receive analog radio frequency (RF) signals; and
a digital communications converter comprising:
an analog signal port coupled to the at least one radiating element;
at least one analog/digital converter comprised of at least one of an analog-to-digital converter (ADC) and a digital-to-analog converter (DAC) coupled to the respective at least one analog signal port and being configured to at least one of convert the analog RF signals received via the at least one radiating element to digital RF signals and convert the digital RF signals to the analog RF signals to be transmitted via the at least one radiating element;
a digital interface configured to at least one of encode the digital RF signal to generate digital communication signals in a digital signal protocol on a digital transmission medium based on the digital RF signals and generate the digital RF signals based on the digital communication signals in the digital transmission medium; and
a digital medium port configured to receive the digital communications cable for transmission of the digital communications signal between the digital communications converter and a control system associated with the vehicle.

13. The system of claim 12, wherein the antenna structure is arranged as a blade antenna, such that the antenna structure is arranged as a fairing corresponding to the at least one radiating element.

14. The system of claim 12, wherein the antenna structure is arranged as a whip antenna, such that the at least one radiating element comprises a monopole whip antenna element.

15. The system of claim 12, wherein the at least one analog/digital converter comprises:
an analog-to-digital converter (ADC) configured to convert the analog RF signals received via the at least one radiating element to the digital RF signals;
a digital-to-analog converter (DAC) configured to convert the digital RF signals to the analog RF signals; and
a power amplifier configured to amplify the analog RF signals for transmission via the at least one radiating element.

16. The system of claim 12, wherein the at least one analog signal port of the digital communications converter is integrally coupled with the at least one radiating element.

17. A vehicle communication system comprising:
a vehicle antenna system comprising:
an antenna structure coupled to an exterior surface of a vehicle, the antenna structure comprising at least one radiating element configured to at least one of wirelessly transmit and receive analog radio frequency (RF) signals; and
a digital communications converter comprising at least one analog signal port coupled to the at least one radiating element and a digital interface configured to at least one of receive the analog RF signals or transmit the analog RF signals via the respective at least one analog signal port and to convert between the analog RF signals and digital RF signals and to encode the digital RF signals to generate digital communication signals corresponding to a digital communications protocol for transmission on a digital transmission medium that are at least one of transmitted to the digital communications converter via a digital communications cable and transmitted from the digital communications converter via the digital communications cable;

a digital vehicle control system configured to generate and receive the digital communication signals; and a digital communications cable interconnecting the vehicle antenna system and the digital vehicle control system and being configured to propagate the digital communications signal on the digital transmission medium between the vehicle antenna system and the digital vehicle control system.

18. The system of claim 17, wherein the antenna structure is arranged as a blade antenna, such that the antenna structure is arranged as a fairing corresponding to the at least one radiating element.

19. The system of claim 17, wherein the antenna structure is arranged as a whip antenna, such that the at least one radiating element comprises a monopole whip antenna element.

20. The system of claim 17, wherein the at least one radiating element comprises an analog signal port, wherein the at least one analog signal port of the digital communications converter is mechanically and directly coupled to the analog signal port of the at least one radiating element, and wherein the digital communications converter has a substantially compatible dimensional form-factor with respect to the at least one radiating element including mounting holes and/or aerodynamic physical dimensions.

* * * * *